(12) United States Patent
Kriebernegg (10) Patent No.: US 7,928,810 B2
(45) Date of Patent: Apr. 19, 2011

(54) OSCILLATOR ARRANGEMENT AND METHOD FOR OPERATING AN OSCILLATING CRYSTAL

(75) Inventor: Josef Kriebernegg, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 93 days.

(21) Appl. No.: 12/282,313

(22) PCT Filed: Mar. 9, 2007

(86) PCT No.: PCT/EP2007/002107
§ 371 (c)(1),
(2), (4) Date: Mar. 9, 2009

(87) PCT Pub. No.: WO2007/101708
PCT Pub. Date: Sep. 13, 2007

(65) Prior Publication Data
US 2009/0219103 A1    Sep. 3, 2009

(30) Foreign Application Priority Data

Mar. 9, 2006 (DE) .......................... 10 2006 010 978

(51) Int. Cl.
*H03B 5/36* (2006.01)
(52) U.S. Cl. .................................... 331/116 R; 331/158
(58) Field of Classification Search .................. 331/158, 331/116 FE, 185
See application file for complete search history.

(56) References Cited

U.S. PATENT DOCUMENTS

| 5,113,153 | A | * | 5/1992 | Soyuer ........................ 331/61 |
| 5,166,645 | A | * | 11/1992 | Watts ........................... 331/37 |
| 5,805,027 | A | * | 9/1998 | Yin ........................ 331/116 FE |
| 6,337,604 | B1 | * | 1/2002 | Clarke ...................... 331/116 R |
| 7,683,730 | B2 | * | 3/2010 | Cetin et al. ................... 331/186 |
| 2007/0120600 | A1 | * | 5/2007 | Byun et al. ..................... 330/253 |

FOREIGN PATENT DOCUMENTS

| DE | 107 1082 | 7/1974 |
| DE | 107182 | 7/1974 |
| DE | 37 34 146 | 6/1988 |
| DE | 43 05 850 | 10/1993 |
| EP | 0 488 394 | 6/1992 |
| EP | 0 978 945 | 2/2000 |

OTHER PUBLICATIONS

A.M. Hudor, Jr., "FET-controlled crystal yields low distortion", EDN Electrical Design News, Reed Business Information, vol. 25, No. 21, p. 201, Nov. 20, 1980. U. Tietze et al., "Halbleiter-Schaltungstechnik", 6th edition, Springer-Verlag, pp. 140-143, Berlin, 1983.
U. Tietze et al., "Grundwellen-Oszillatoren", 12th edition, Springer-Verlag, Chapter 14.2.2, pp. 881-883, 2002.

* cited by examiner

*Primary Examiner* — Joseph Chang
(74) *Attorney, Agent, or Firm* — Cohen Pontani Lieberman & Pavane LLP (57) ABSTRACT

The oscillator arrangement (1) comprises a differential amplifier (13) and also a first and a second terminal (2, 3). The first terminal (2) of the oscillator arrangement (1) can be coupled via a quartz resonator (10) to the second terminal (3) of the oscillator arrangement (1) and via a first capacitor (11) to a reference voltage terminal (8). The second terminal (3) of the oscillator arrangement (1) can be coupled via a second capacitor (12) to the reference voltage terminal (8). The differential amplifier (13) is connected at a first input (14) to the first terminal (2) of the oscillator arrangement (1) and at an output (16) to the second terminal (3) of the oscillator arrangement (1). The second input (15) of the differential amplifier (13) is connected via a direct voltage source (21) to the reference voltage terminal (8).

10 Claims, 4 Drawing Sheets

OSCILLATOR ARRANGEMENT AND METHOD FOR OPERATING AN OSCILLATING CRYSTAL

RELATED APPLICATIONS

This is a U.S. national stage under 35 USC 371 of application No. PCT/EP2007/002107 filed on Mar. 9, 2007.

This application claims the priority of German application no. 10 2006 010 978.3 filed Mar. 9, 2006, the content of which is hereby incorporated by reference.

FIELD OF THE INVENTION

The present invention relates to an oscillator arrangement, a use of the oscillator arrangement, and a method for operating a quartz resonator.

BACKGROUND OF THE INVENTION

Oscillator arrangements are used, for example, in computers, digital cameras, clocks, and mobile communication devices for generating an alternating signal. From the alternating signal, typically a timing signal is generated, which can be used for controlling digital circuits.

Chapter 14.2.2 of the *Publication Halbleiter-Schaltungstechnik* [Semiconductor circuit technology], U. Tietze, Ch. Schenk, 12th edition, Springer Verlag 2002, entitled "Fundamental wave oscillators" shows, in Figure 14.17 on page 882, a Pierce oscillator with a quartz resonator, between whose terminals a resistor is connected. A first terminal of the quartz resonator is coupled via an inverter to a second terminal of the quartz resonator, which forms the output of the oscillator arrangement.

SUMMARY OF THE INVENTION

One object of the present invention is to provide an oscillator arrangement and a method for operating a quartz oscillator, which guarantee a stable setting of an operating point of the oscillator arrangement.

An oscillator arrangement comprises a first and a second terminal, between which a quartz resonator can be coupled, and also a differential amplifier. The first terminal of the oscillator arrangement can be coupled via a first capacitor to a reference voltage terminal. Likewise, the second terminal of the oscillator arrangement can be coupled via a second capacitor to the reference voltage terminal. The differential amplifier has a first and a second input, as well as an output. The first input of the differential amplifier is connected to the first terminal of the oscillator arrangement. The output of the differential amplifier is coupled to the second terminal of the oscillator arrangement.

A direct voltage can be fed to the second input of the differential amplifier.

Advantageously, a stable operating point of the oscillator arrangement is set by means of the direct voltage that is fed to the second input of the differential amplifier.

Preferably, an input signal that can be tapped at a terminal of the quartz resonator is applied to the first input of the differential amplifier. The differential amplifier provides an output signal at its output, which can be fed to another terminal of the quartz resonator, as a function of comparing the input signal at the first input with the direct voltage on the second input. The output signal is output by the oscillator arrangement.

Advantageously, the first and the second capacitor are used for setting a phase condition of a control loop comprising the quartz resonator in a forward branch of the control loop and the differential amplifier in a feedback branch of the control loop. At small amplitudes, a loop gain of the control loop advantageously has a value greater than one for stimulation of oscillations and the value one for maintaining oscillation. The control loop advantageously satisfies the phase condition for an oscillation of 360° or a multiple of 360°. Advantageously, the first and the second capacitors are set in such a way that the phase condition is satisfied.

Preferably, the second input of the differential amplifier is connected via a direct voltage source, which provides the direct voltage, to the reference voltage terminal. Advantageously, the oscillator arrangement thus achieves a stable setting of a direct voltage operating point of the oscillator arrangement also for a very small supply voltage.

In one refinement, the oscillator arrangement comprises a resistor, which couples the first terminal with the second terminal of the oscillator arrangement. Advantageously, the resistor is used for setting direct voltage components of the input signal and the output signal.

The resistor can be realized as a thin-film resistor. Alternatively, the resistor can be realized as a metal-film resistor or as a polysilicon resistor on a semiconductor body, which comprises the oscillator arrangement. Alternatively, the resistor can be constructed, in turn, as a diffusion resistor, which is doped corresponding to a well in the semiconductor body.

Preferably, the resistor is constructed as a transistor. According to the preferred embodiment, the resistor has a first transistor, which is connected at a first terminal to the first terminal of the oscillator arrangement and at a second terminal to the second terminal of the oscillator arrangement. Advantageously, the surface requirements on the semiconductor body for a first transistor connected as a resistor is much less than for a polysilicon resistor or a diffusion resistor.

The first transistor can be formed as a field-effect transistor. Preferably, the first transistor is realized as a metal-oxide semiconductor field-effect transistor.

The first transistor can be realized as an N-channel field-effect transistor, in which a control terminal is connected to a power supply voltage terminal.

Preferably, the first transistor is formed as a P-channel field-effect transistor, which is connected at a control terminal to the reference voltage terminal.

The oscillator arrangement can comprise a voltage divider, which connects between the power supply voltage terminal and the reference voltage terminal and which is connected at a tap to the second input of the differential amplifier for feeding the direct voltage. The voltage divider is used here as a direct voltage source.

Preferably, the oscillator arrangement has a second transistor, which is connected to a first terminal at the reference voltage terminal and to a second terminal at the second input of the differential amplifier. The second terminal of the second transistor is coupled to the power supply voltage terminal.

The second transistor can be realized as a field-effect transistor. Preferably, the second transistor is formed as a metal-oxide semiconductor field-effect transistor. The second transistor can be provided as a P-channel field-effect transistor, which is connected at one control terminal to the reference voltage terminal. The second terminal of the second transistor can be coupled via a resistor to the power supply voltage terminal. Preferably, the second terminal of the second transistor is coupled via a second current source to the power supply voltage terminal. Advantageously, the direct voltage source comprises the second transistor and the second current source, since surface requirements for such a direct voltage source are significantly less than for a voltage divider that comprises two diffusion or two polysilicon resistors. In addition, the second transistor has a lower parasitic capacitance than a resistor arranged in or on the semiconductor body. The lower parasitic capacitance advantageously acts on the oscillation stimulation response of the oscillator arrangement. In one embodiment, a resistor value can equal, for example, 10 MΩ, in order to produce current consumption of the oscillator arrangement of 300 nA or less.

Advantageously, the first and the second transistors are realized as field-effect transistors of the same conductivity type. Advantageously, the first and the second transistor have the same threshold voltage. In a preferred embodiment, the first and the second transistors are realized as P-channel field-effect transistors. The threshold voltage of transistors can typically vary from wafer to wafer or within a wafer during fabrication by means of a complementary-metal-oxide semiconductor integration technology, abbreviated CMOS integration technology. The first and second transistors are preferably integrated adjacent to each other, so that a deviation of the threshold voltage is very small. The resistor behavior of the first transistor is advantageously approximately constant, because the first and the second transistors have approximately the same threshold voltage, even when the absolute values of the threshold voltages of the first and the second transistors deviate from a default value. Advantageously, the second input of the differential amplifier is used as a direct-voltage reference point, in order to set the first transistor at a preferred operating point. By means of the second transistor and the second current source, advantageously, the direct voltage fed to the second input of the differential amplifier is generated. Because the first and the second transistor have similar properties, this embodiment of the direct voltage source allows a stable operation of the first transistor as a resistor even at a value of the power supply voltage of less than 1 V.

In one embodiment, the differential amplifier has a first and a second input transistor. The first input transistor is attached at a control terminal to the first input of the differential amplifier. Accordingly, the second input transistor is attached at a control terminal to the second input of the differential amplifier. The two input transistors can be interconnected for forming a differential stage.

Preferably, the two input transistors are each connected at a first terminal to a terminal base of the differential stage. The terminal base of the differential stage can be coupled via a resistor to the reference voltage terminal. In one preferred embodiment, the differential amplifier has a first current source, which couples the terminal base, that is, the two first terminals of the two input transistors, to the reference voltage terminal. A second terminal of the first input transistor can be coupled to the output of the differential amplifier.

In one refinement, the differential amplifier has a current mirror, by means of which every second terminal of the two input transistors is coupled to the power supply voltage terminal. The current mirror has a first and a second current mirror transistor. Advantageously, the number of transistors, which are connected in a branch of the differential amplifier in series between the power supply voltage terminal and the reference voltage terminal, can be kept small. For operation, a value of the power supply voltage can be sufficient that has the value of a voltage between the control terminal and another terminal of a transistor plus twice the value of a voltage between the two terminals of the controlled path of a transistor for saturated operation. Therefore, advantageously, the differential amplifier and the total oscillator arrangement can be operated with a low power supply voltage, for example, less than one volt.

In one embodiment, the first and the second current mirror transistors have approximately the same current driving capability. Advantageously, the first and the second current mirror transistors can have approximately the same channel width and the same channel length.

Alternatively or additionally, the first and the second input transistors can exhibit approximately the same current driving capability. Advantageously, the channel width and the channel length of the two input transistors can be approximately equal.

In another embodiment, the first input transistor, the second input transistor, the first current mirror transistor, and the second current mirror transistor have approximately the same current driving capability.

In one embodiment, the first input transistor has a first current driving capability and the second input transistor has a second current driving capability, which are less than the first current driving capability by a first factor of n. Advantageously, the first input transistor can have a ratio of channel width to channel length that is greater than a ratio of channel width to channel length of the second input transistor by approximately the first factor n.

In one refinement, the first input transistor and the first current mirror transistor have approximately the first current driving capability. According to this refinement, accordingly, the second input transistor and the second current mirror transistor have the second current driving capability, which is less than the first current driving capability by the first factor n. Advantageously, the first current mirror transistor can have a ratio of channel width to channel length that is greater than a ratio of channel width to channel length of the second current mirror transistor by approximately the first factor n. Advantageously, the first input transistor can likewise have a ratio of channel width to channel length that is greater than a ratio of channel width to channel length of the second input transistor by approximately the first factor n. Thus, a current flow in a second branch of the differential amplifier is less than a current flow in a first branch of the differential amplifier. Therefore, advantageously, a very low power consumption can be realized.

The oscillator arrangement can be used for operating a disk-shaped quartz resonator. It can be used for operating quartz resonators with a resonance frequency between 1 and 100 MHz. The oscillator arrangement can also be provided for operating a low-frequency quartz resonator. A quartz resonator, which is formed according to the tuning-fork principle, can be coupled to the oscillator arrangement. The oscillator arrangement can be used for quartz resonators with a resonance frequency less than 100 kHz.

The oscillator arrangement can be used preferably for quartz resonators with a resonance frequency of approximately 32 to 33 kHz.

The oscillator arrangement can be realized in a bipolar integration technology. Preferably, the oscillator arrangement can be fabricated by means of CMOS integration technology.

A semiconductor body can comprise the oscillator arrangement having the differential amplifier, the first and second transistors, and the second current source. Alternatively, the semiconductor body can also comprise the first and the second capacitor.

In one embodiment, in the oscillator arrangement, the quartz resonator is connected between the first and the second terminal of the oscillator arrangement.

A method for operating a quartz oscillator has the following steps: a differentially amplified output signal is generated. The differentially amplified output signal is output to a quartz resonator. An input signal provided by the quartz resonator is compared with a direct voltage and amplified, and in this way the differentially amplified output signal is obtained.

Therefore, advantageously, the quartz resonator is operated at a stable operating point.

In one refinement, a resistive coupling is provided parallel to the quartz resonator. The resistive coupling can comprise a first transistor that is connected as a resistor.

BRIEF DESCRIPTION OF THE DRAWINGS

The invention is explained in more detail below using several embodiments with reference to the figures. Components with identical functions or effects carry identical reference symbols. Insofar as circuit parts or components correspond in function, their description will not be repeated in each of the following figures.

DETAILED DESCRIPTION OF THE DRAWINGS

Figure 1:
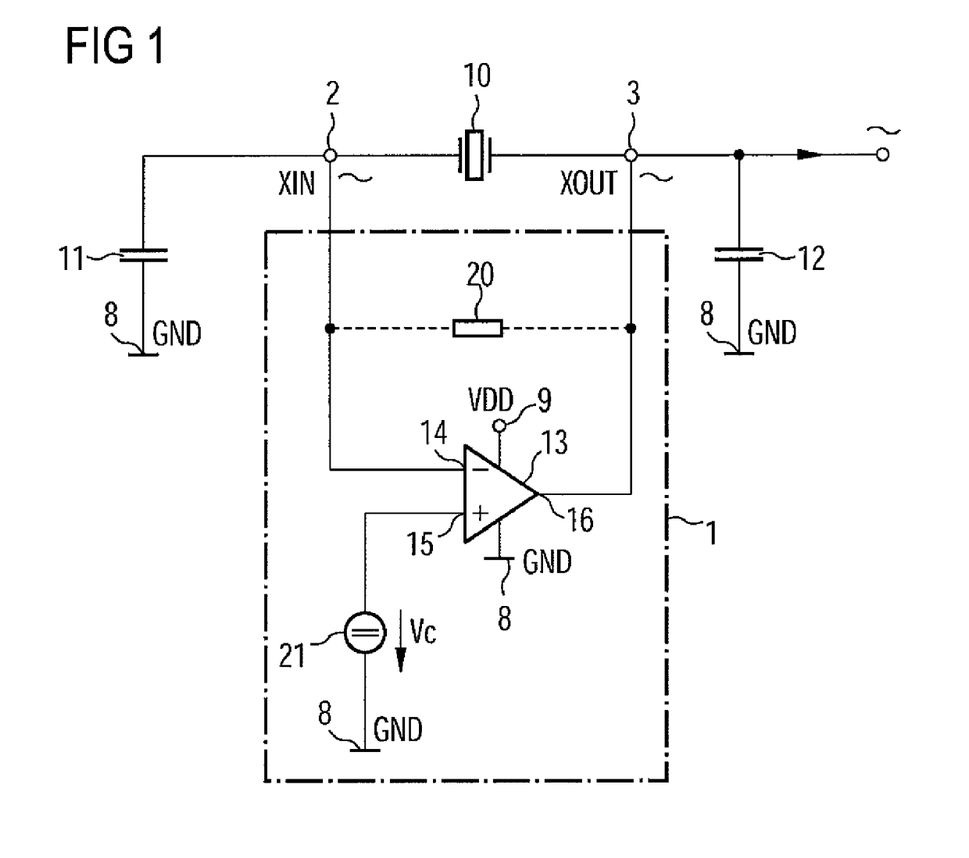
FIG. 1 shows an embodiment example of an oscillator arrangement in a block circuit diagram according to the invention.

FIG. 1 shows an embodiment example of an oscillator arrangement 1 in a block circuit diagram, which comprises a differential amplifier 13, which is coupled to a first capacitor 11, a second capacitor 12, and a quartz resonator 10. The differential amplifier 13 has a first input 14 that is formed as an inverting input, a second input 15 that is formed as a non-inverting input, and an output 16. The differential amplifier 13 is connected to a power supply voltage terminal 9 and a reference voltage terminal 8 for supplying power. The output 16 of the differential amplifier 13 is connected to a second terminal 3 of the oscillator arrangement 1 and is coupled via the second capacitor 12 to the reference voltage terminal 8. The quartz resonator 10 is connected between a first terminal 2 and the second terminal 3 of the oscillator arrangement. The first terminal 2 of the oscillator arrangement 1 is connected to the first input 14 of the differential amplifier 13 and is coupled via the first capacitor 11 to the reference voltage terminal 8. The second input 15 of the differential amplifier 13 is connected via a direct voltage source 21 to the reference voltage terminal 8.

At the output 16 of the differential amplifier 13 and thus at the second terminal 3, an output signal XOUT can be tapped, which is fed to the quartz oscillator 10 and which represents an output signal of the oscillator arrangement. On the first terminal 2 of the oscillator arrangement 1, an input signal XIN can be tapped, which is fed to the first input 14 of the differential amplifier. A direct voltage VC is fed to the second input 15 of the differential amplifier 13. The differential amplifier 13 provides the output signal XOUT as a function of a difference between the input signal XIN and the direct voltage VC.

Advantageously, an operating point of the oscillator arrangement 1 can be set by means of the direct voltage VC.

In an alternative embodiment, a resistor 20 is connected between the first and the second terminal 2, 3 of the oscillator arrangement 1. Thus, advantageously, a direct voltage-related connection is realized in the form of a resistive coupling between the first and the second terminal 2, 3. A direct voltage potential of the output signal XOUT influences a direct voltage potential of the input signal XIN and vice versa.

Figure 2A:
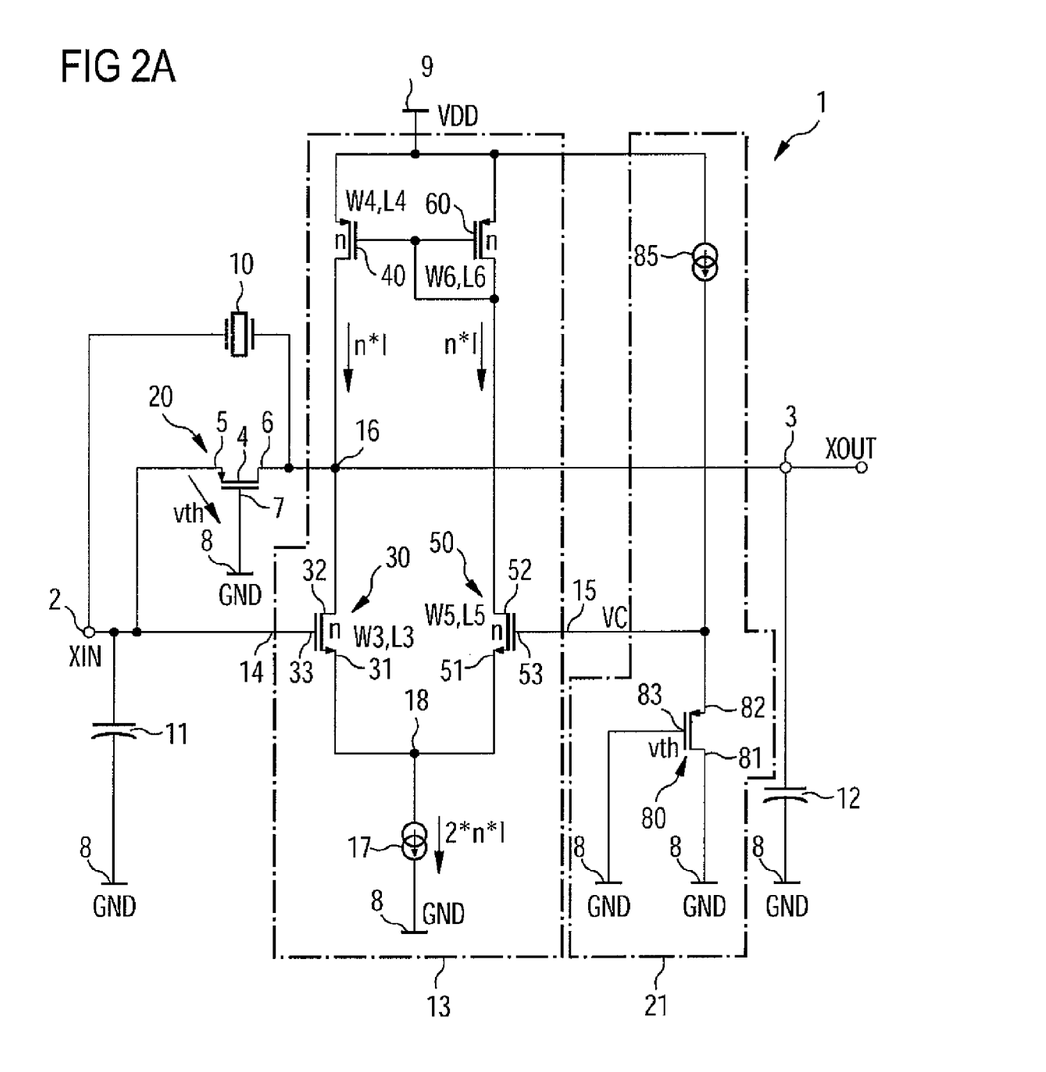
FIGS. 2A-2C show other embodiment examples of an oscillator arrangement according to the invention.

FIG. 2A shows an embodiment example of the oscillator arrangement 1 according to the invention, which represents a refinement of the arrangement according to FIG. 1. The oscillator arrangement 1 comprises the differential amplifier 13 and is coupled to the quartz resonator 10 and the first and the second capacitors 11, 12. In addition, the oscillator arrangement 1 comprises the resistor 20, which is connected between the first and the second terminal 2, 3. The resistor 20 has a first transistor 4, which is connected at a first terminal 5 to the first terminal 2 of the oscillator arrangement 1 and at a second terminal 6 to the second terminal 3 of the oscillator arrangement 1. The first transistor 4 is connected at a control terminal 7 to the reference voltage terminal 8. In addition, the oscillator arrangement 1 has a second transistor 80 and a second current source 85, which are connected to each other in series and which are connected between the power supply voltage terminal 9 and the reference voltage terminal 8. A node between the second transistor 80 and the second current source 85 is connected to the second input 15 of the differential amplifier 13. A first terminal 81 and a control terminal 83 of the second transistor 80 are connected to the reference voltage terminal 8. A second terminal 82 of the second transistor 80 is connected to the second current source 85. The direct voltage source 21 thus comprises the second transistor 80 and the current source 85.

The differential amplifier 13 has a first and a second input transistor 30, 50, which are connected to each other at a first terminal 31, 51 and which are coupled to the reference voltage terminal 8 via a first current source 17. A node, at which the first terminals 31, 51 of the first and the second input transistor 30, 50 are connected to each other, is used as a base point 18 of the differential stage. A control terminal 33 of the first input transistor 30 is connected to the first input 14, and a control terminal 53 of the second input transistor 50 is connected to the second input 15 of the differential amplifier 13. The differential amplifier 13 has a first and a second current mirror transistor 40, 60. The first current mirror transistor 40 couples a second terminal 32 of the first input transistor 30, and the second current mirror transistor 60 a second terminal 52 of the second input transistor 50, to the power supply voltage terminal 9. The second terminal 32 of the first input transistor 30 is connected to the output 16 of the differential amplifier 13. The two control terminals of the first and the second current mirror transistor 40, 60 are connected to each other and to a terminal of the second current mirror transistor 60 for forming a current mirror.

By means of the second current source 85 and the second transistor 80, a direct voltage VC is provided, which is fed to the second input 15 of the differential amplifier 13. At the first terminal 2 of the oscillator arrangement 1, an input signal XIN can be tapped, which is fed to the first input 14 of the differential amplifier 13. The differential amplifier 13 provides an output signal XOUT at the output 16 of the differential amplifier 13 and at the second terminal 3, which is formed as a function of the input signal XIN and the direct voltage VC. The output signal XOUT is applied, in turn, to the quartz resonator 10, so that the input signal XIN can be tapped at the first terminal 2 of the oscillator arrangement 1. A power supply voltage VDD has a positive value, that is, a potential on the power supply voltage terminal 9 is higher than a reference voltage GND on the reference voltage terminal 8. The first transistor 4 is used as a feedback resistor 20. The differential amplifier 13 advantageously guarantees a large adjustment range of a direct voltage operating point. Therefore, the control terminal 7 of the first transistor 4 can be connected to the reference voltage terminal 8. Because the threshold voltage vth of the second transistor 80 is approximately equal to the threshold voltage vth of the first transistor 4, the first transistor 4 is operated in a resistance range of a transistor characteristic line. Advantageously, this is also the case for a power supply voltage VDD less than 1 V. Advantageously, the direct voltage setting of the oscillator arrangement 1 is essentially independent of process and temperature fluctuations.

The first and the second input transistors 30, 50 are constructed as N-channel field-effect transistors with a first channel width W3, W5 and a first channel length L3, L5. The first and the second current mirror transistors 40, 60 with a second channel width W4, W6 and a second channel length L4, L6, as well as the first and the second transistors 4, 80 are realized as P-channel field-effect transistors.

Advantageously, the current driving capability of the transistors 30, 40 in the first branch is equal to the current driving capability of the transistors 50, 60 in the second branch of the differential amplified 13 and thus the differential amplifier has a symmetrical configuration. Advantageously, the operating point of the differential amplifier 13 can be set by means of the direct voltage VC.

In one alternative embodiment, the power supply voltage VDD is negative, that is, the voltage at the power supply voltage terminal 9 is less than the reference voltage GND at the reference voltage terminal 8. In the alternative embodiment, the first and the second transistors 4, 80 and also the first and the second current mirror transistors 40, 60 are constructed as N-channel field-effect transistors. Correspondingly, the first and the second input transistors 30, 50 are constructed as P-channel field-effect transistors.

Figure 2B:
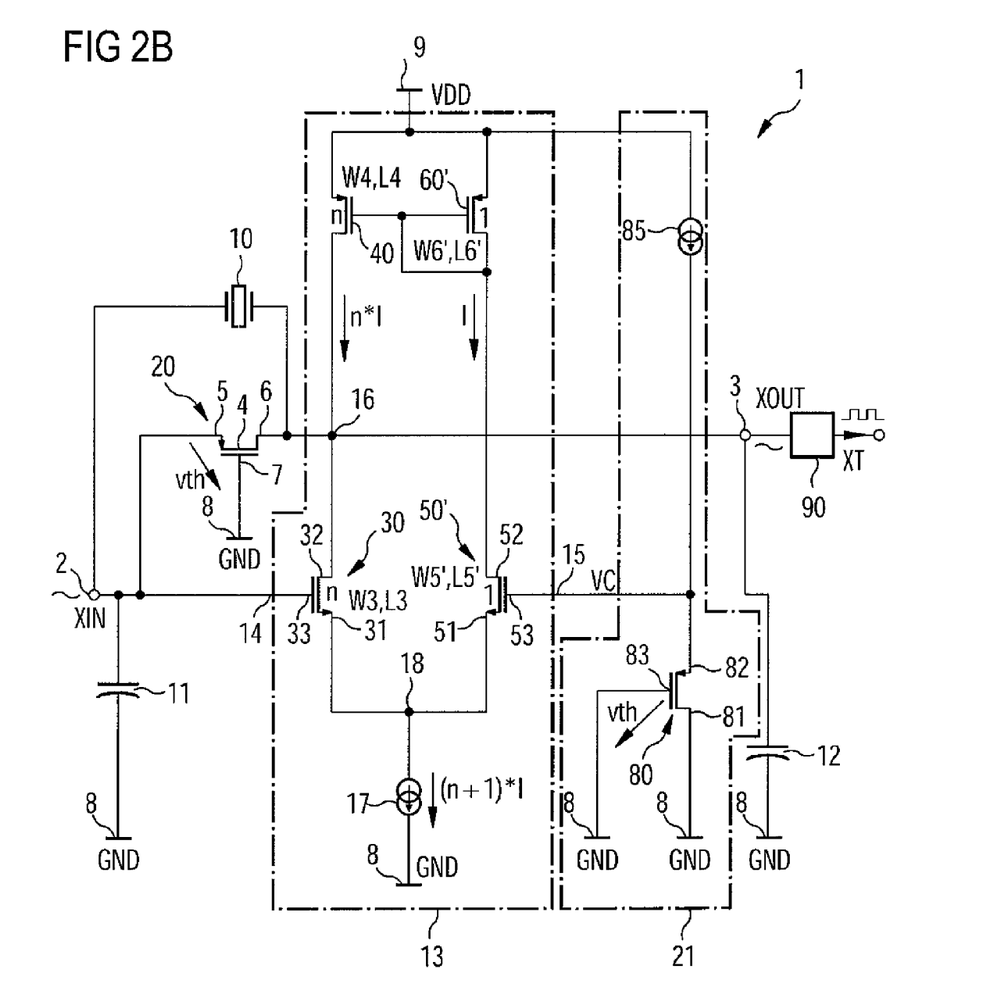

FIG. 2B shows another embodiment example of an oscillator arrangement according to the invention, which represents a refinement of the oscillator arrangement 1 according to FIG. 2A. In contrast to the oscillator arrangement 1 in FIG. 2A, the differential amplifier 13 according to FIG. 2B has a second input transistor 50' with a third channel width W5' and a third channel length L5' and a second current mirror transistor 60' with a fourth channel width W6' and a fourth channel length L6'. The first input transistor 30 exhibits a current driving capability that is higher by a first factor of n compared with the second input transistor 50'. Therefore, the ratio of the first channel width W3 to the first channel length L3 is greater by the factor n than the ratio of the third channel width W5' to the third channel length L5'. Accordingly, the first current mirror transistor 40 has a current driving capability that is higher by the first factor n compared with the second current mirror transistor 60'. Therefore, the ratio from the second channel width W4 to the second channel length L4 is greater by the first factor n than the ratio from the fourth channel width W6' to the fourth channel length L6'. A timing-signal converter 90 is connected to the second terminal 3 of the oscillator arrangement 1. The timing-signal converter 90 is constructed as an inverter.

The output signal XOUT is provided as an alternating voltage and can be tapped at the second terminal 3. On the input side, the output signal XOUT is fed to the timing signal converter 90. On the output side, a timing signal XT is provided at the timing-signal converter 90. A current, I, flows through the second branch of the differential amplifier 13, while an n-times current, n*I, flows through the first branch of the differential amplifier 13. The first current source 17 is designed to provide a current I through the second branch of the differential amplifier 13 by the first factor n increased by 1.

For operating the oscillator arrangement according to FIGS. 2A and 2B, a power supply voltage VDD is sufficient that has the value of a voltage between the control terminal and another terminal of a transistor plus two times the value of a voltage between the two terminals of the controlled section of a transistor for saturated operation. Therefore, advantageously, the oscillator arrangement 1 can be operated with a low value for the power supply voltage VDD.

Advantageously, due to the lower current flow in the second branch of the differential amplifier 13, the power consumption in the oscillator arrangement 1 according to FIG. 2B is lower than in the oscillator arrangement 1 according to FIG. 2A.

Figure 2C:
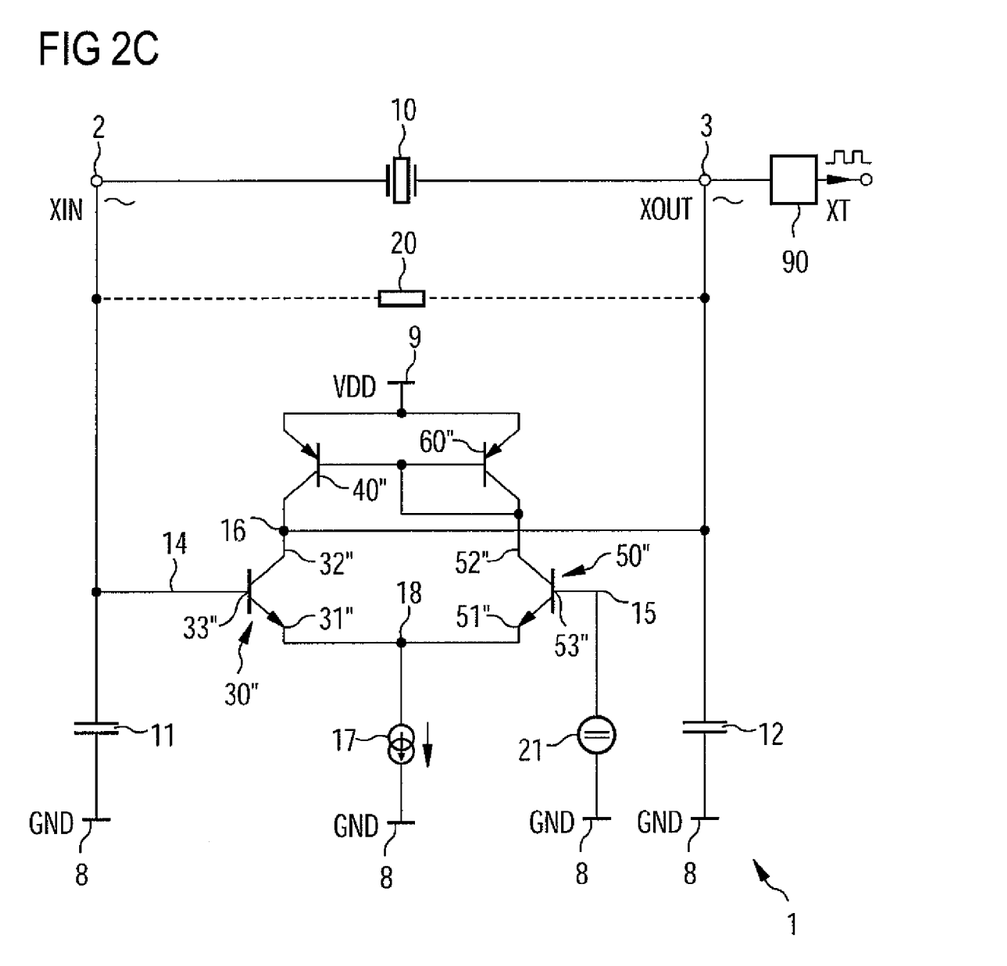

FIG. 2C shows another embodiment example of an oscillator arrangement that represents a refinement of the oscillator arrangement according to FIG. 1. The differential amplifier 13 according to FIG. 2C has a first and a second input transistor 30", 50", which are realized as bipolar transistors. An emitter terminal 31" of the first input transistor 30" is connected to an emitter terminal 51" of the second input transistor 50" and is coupled via the first current source 17 to the reference voltage terminal 8. The differential amplifier 13 also has a current mirror with a first and a second current mirror transistor 40", 60", which are formed as bipolar transistors. An emitter terminal of the first and an emitter terminal of the second current mirror transistor 40", 60" are connected to the power supply voltage terminal 9. A base terminal of the first current mirror transistor 40" and a base terminal of the second current mirror transistor 60" are connected to each other and to a collector terminal of the second current mirror transistor 60". The collector terminal of the second current mirror transistor 60' is connected to a collector terminal 52" of the second input transistor 50".

Accordingly, a collector terminal of the first current mirror transistor 40" is connected to a collector terminal 32" of the first input transistor 30". In addition, the output 16 of the differential amplifier 13 is connected to the second terminal 3 of the oscillator arrangement 1 and to a node between the first input transistor 30" and the first current mirror transistor 40". A base terminal 33" of the first input transistor 30" is connected to the first terminal 2 of the oscillator arrangement 1. A base terminal 53" of the second input transistor 50" is connected to the direct voltage source 21.

Advantageously, the oscillator arrangement 1 can already be operated with a small power supply voltage VDD, because in the differential amplifier 13 only three active elements are connected between the power supply voltage terminal 9 and the reference voltage terminal 8. In the first branch, these are the first current mirror transistor 40", the first input transistor 30", and the first current source 17, and in the second branch, these are the second current mirror transistor 60", the second input transistor 50", and also the first current source 17.

For operation, a power supply voltage VDD can be sufficient that has the value of a voltage between the base terminal and the emitter terminal of a transistor plus two times the value of the saturation voltage of a transistor. Thus, the oscillator arrangement 1 is advantageous relative to oscillator arrangements with several cascaded transistors, especially for a low value of the power supply voltage VDD.

In one alternative embodiment, the resistor 20 is connected between the first and the second terminal 2, 3 of the oscillator arrangement 1.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An oscillator arrangement comprising:
a first terminal coupled by a quartz resonator to a second terminal of the oscillator arrangement and by a first capacitor to a reference voltage terminal;
the second terminal being coupled by a second capacitor to the reference voltage terminal; and
a differential amplifier including:
a first input connected to the first terminal of the oscillator arrangement,
a second input connected by a direct voltage source to the reference voltage terminal, and
an output connected to the second terminal of the oscillator arrangement; and
a resistor is connected between the first and the second terminal of the oscillator arrangement and including a first transistor including:
a first terminal connected to the first terminal of the oscillator arrangement,
a second terminal connected to the second terminal of the oscillator arrangement, and
a control terminal connected to the reference voltage terminal;
wherein the direct voltage source includes:
a second transistor connected at a control terminal and at a first terminal to the reference voltage terminal and at a second terminal to the second input of the differential amplifier for providing a direct voltage, and
a second current source which couples the second terminal of the second transistor to a power supply voltage terminal; and
wherein the first and the second transistors are field-effect transistors of the same conductivity type.

2. The oscillator arrangement according to claim 1, wherein the first transistor and the second transistor have approximately the same threshold voltage.

3. The oscillator arrangement according to claim 1, wherein the differential amplifier includes:
a first input transistor connected at a control terminal to the first input of the differential amplifier, and
a second input transistor connected at a control terminal to the second input of the differential amplifier, wherein the first and the second input transistors are interconnected for forming a differential stage.

4. The oscillator arrangement according to claim 3, wherein the differential amplifier comprises a first current source connected to a terminal base of the differential stage and which couples a first terminal of the first input transistor and a first terminal of the second input transistor to the reference voltage terminal.

5. The oscillator arrangement according to claim 3, wherein a second terminal of the first input transistor is connected to the output of the differential amplifier.

6. The oscillator arrangement according to claim 3, wherein the differential amplifier comprises a current mirror including:
a first current mirror transistor which couples a second terminal of the first input transistor to a power supply voltage terminal, and
a second current mirror transistor which couples a second terminal of the second input transistor to the power supply voltage terminal and which is connected at a control terminal and at a first terminal to a control terminal of the first current mirror transistor.

7. The oscillator arrangement according to claim 6, wherein the first input transistor, the second input transistor, the first current mirror transistor, and the second current mirror transistor have approximately the same current driving capability.

8. The oscillator arrangement according to claim 6, wherein
the first input transistor and the first current mirror transistor have approximately the first current driving capability, and
the second input transistor and the second current mirror transistor have a second current driving capability which is less than the first current driving capability by a first factor n.

9. The oscillator arrangement according to claim 1, wherein
the oscillator arrangement comprises the quartz resonator connected between the first and the second terminal of the oscillator arrangement.

10. A method for operating a quartz oscillator, comprising:
preparing a resistive coupling parallel to the quartz resonator, the resistive coupling comprising a first transistor connected as a resistor;
preparing a differentially amplified output signal as a function of a comparison of an input signal and a direct voltage, which is provided by means of a second current source and a second transistor, wherein the second transistor and the second current source are connected in series to each other and between a power supply voltage terminal and a reference voltage terminal, the first and the second transistors are realized as field-effect transistors of the same conductivity type, and a control terminal of the first transistor and a control terminal of the second transistor are connected to the reference voltage terminal;
applying the differentially amplified output signal on the quartz resonator; and
tapping the input signal on the quartz resonator.

* * * * *

UNITED STATES PATENT AND TRADEMARK OFFICE
CERTIFICATE OF CORRECTION

PATENT NO. : 7,928,810 B2  Page 1 of 1
APPLICATION NO. : 12/282313
DATED : April 19, 2011
INVENTOR(S) : Josef Kriebernegg It is certified that error appears in the above-identified patent and that said Letters Patent is hereby corrected as shown below:

Title Page,

Item (56) References Cited

FOREIGN PATENT DOCUMENTS delete "DE 107 1082 7/1974"

insert -- DD 107 182 7/1974 --

In the Claims:

Column 9, line 18 (claim 1, line 14) delete "is".

Signed and Sealed this
Twenty-third Day of July, 2013

Teresa Stanek Rea
*Acting Director of the United States Patent and Trademark Office*